US010420257B2

(12) United States Patent
Dunn et al.

(10) Patent No.: US 10,420,257 B2
(45) Date of Patent: *Sep. 17, 2019

(54) SYSTEM AND METHOD FOR MAINTAINING A CONSISTENT TEMPERATURE GRADIENT ACROSS AN ELECTRONIC DISPLAY (71) Applicant: Manufacturing Resources International, Inc., Alpharetta, GA (US)

(72) Inventors: William Dunn, Alpharetta, GA (US); Chris Tran, Alpharetta, GA (US); Tim Hubbard, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/456,117

(22) Filed: Mar. 10, 2017

(65) Prior Publication Data
US 2017/0188490 A1 Jun. 29, 2017

Related U.S. Application Data (63) Continuation of application No. 14/247,658, filed on Apr. 8, 2014, now Pat. No. 9,594,271, which is a (Continued)

(51) Int. Cl.
*G02F 1/1333* (2006.01)
*H05K 7/20* (2006.01)
(Continued)

(52) U.S. Cl.
CPC ....... *H05K 7/20972* (2013.01); *G02F 1/0105* (2013.01); *G02F 1/133385* (2013.01);
(Continued)

(58) Field of Classification Search
CPC .................................. G02F 1/133385
See application file for complete search history.

(56) References Cited

U.S. PATENT DOCUMENTS 4,093,355 A    6/1978   Kaplit et al.
4,593,978 A    6/1986   Mourey et al.
(Continued)

FOREIGN PATENT DOCUMENTS

CN    0N2702363 Y    5/2005
CN      2702363 Y    5/2005
(Continued)

OTHER PUBLICATIONS

*Civiq Smartscapes, LLC V. Manufacturing Resources International, Inc.*, Memorandum Opinion re claim construction, Sep. 27, 2018, 16 pages.
(Continued)

*Primary Examiner* — Sang V Nguyen
(74) *Attorney, Agent, or Firm* — Standley Law Group LLP; Jeffrey S. Standley; Eric M. Gayan (57) ABSTRACT

An electronic display assembly having forced-air cooling. A thermally conductive plate or a thermally conductive backlight surface is located behind an electronic display of the electronic display assembly and within a housing thereof such that a gap is formed between the plate or backlight surface and an adjacent wall of the housing. External cooling air may be caused to flow in a top-to-bottom direction through the gap in order to remove heat from the electronic display that has been conductively transferred to the gap. A plurality of ribs may be placed within the gap and in thermal communication with the electronic display to enhance the conductive transfer of heat from the electronic display.

11 Claims, 4 Drawing Sheets

Related U.S. Application Data continuation of application No. 12/952,745, filed on Nov. 23, 2010, now Pat. No. 8,693,185, and a continuation-in-part of application No. 12/641,468, filed on Dec. 18, 2009, now Pat. No. 8,654,302, said application No. 12/952,745 is a continuation-in-part of application No. 12/411,925, filed on Mar. 26, 2009, now Pat. No. 8,854,595, said application No. 12/952,745 is a continuation-in-part of application No. 12/556,029, filed on Sep. 9, 2009, now Pat. No. 8,373,841, said application No. 12/952,745 is a continuation-in-part of application No. 12/620,330, filed on Nov. 17, 2009, now Pat. No. 8,274,622, said application No. 12/952,745 is a continuation-in-part of application No. 12/706,652, filed on Feb. 16, 2010, now Pat. No. 8,358,397, said application No. 12/952,745 is a continuation-in-part of application No. 12/630,469, filed on Dec. 3, 2009, now Pat. No. 8,497,972, and a continuation-in-part of application No. 12/618,104, filed on Nov. 13, 2009, now Pat. No. 8,310,824, and a continuation-in-part of application No. 12/905,704, filed on Oct. 15, 2010, now Pat. No. 8,773,633, said application No. 12/952,745 is a continuation-in-part of application No. 12/753,298, filed on Apr. 2, 2010, now Pat. No. 8,351,014.

(60) Provisional application No. 61/321,364, filed on Apr. 6, 2010, provisional application No. 61/138,736, filed on Dec. 18, 2008, provisional application No. 61/039,454, filed on Mar. 26, 2008, provisional application No. 61/095,615, filed on Sep. 9, 2008, provisional application No. 61/115,333, filed on Nov. 17, 2008, provisional application No. 61/152,879, filed on Feb. 16, 2009, provisional application No. 61/252,295, filed on Oct. 16, 2009.

(51) Int. Cl.
  *G02F 1/01* (2006.01)
  *H05K 5/00* (2006.01)
  *F28F 3/02* (2006.01)
  *F28F 3/12* (2006.01)

(52) U.S. Cl.
  CPC ....... *H05K 5/0017* (2013.01); *H05K 7/20136* (2013.01); *H05K 7/20154* (2013.01); *F28F 3/02* (2013.01); *F28F 3/12* (2013.01); *G02F 2201/36* (2013.01)

(56) References Cited

U.S. PATENT DOCUMENTS

| | | |
|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,043,979 A | 8/1991 | Sakurai et al. |
| 5,088,806 A | 2/1992 | McCartney et al. |
| 5,247,374 A | 9/1993 | Terada |
| 5,282,114 A | 1/1994 | Stone |
| 5,293,930 A | 3/1994 | Pitasi |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A * | 11/1999 | Heady .................... H05K 7/202 165/185 |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Nara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |

(56) References Cited

U.S. PATENT DOCUMENTS

| | | |
|---|---|---|
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 * | 3/2017 | Dunn ................ G02F 1/133385 |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,723,765 B2 | 8/2017 | DeMars |
| 9,894,800 B2 | 2/2018 | Dunn |
| 2001/0001459 A1 | 5/2001 | Savant et al. |
| 2001/0019454 A1 | 9/2001 | Tadic-Galeb et al. |
| 2002/0009978 A1 | 1/2002 | Dukach et al. |
| 2002/0033919 A1 | 3/2002 | Sanelle et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035558 A1 | 2/2004 | Todd et al. |
| 2004/0036834 A1 | 2/2004 | Ohnishi et al. |
| 2004/0042174 A1 * | 3/2004 | Tomioka ................ G06F 1/203 |
| | | 361/679.53 |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 * | 4/2006 | Lee ........................ F21V 29/02 |
| | | 313/35 |
| 2006/0092348 A1 | 5/2006 | Park |
| 2006/0125998 A1 | 6/2006 | Dewa et al. |
| 2006/0132699 A1 * | 6/2006 | Cho ....................... F04D 29/582 |
| | | 349/161 |
| 2006/0177587 A1 * | 8/2006 | Ishizuka ............... B05D 3/0413 |
| | | 427/348 |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |

(56) References Cited

U.S. PATENT DOCUMENTS

| | | | |
|---|---|---|---|
| 2008/0283234 A1 | 11/2008 | Sagi et al. | |
| 2008/0285290 A1 | 11/2008 | Ohashi et al. | |
| 2009/0009047 A1 | 1/2009 | Yanagawa et al. | |
| 2009/0009729 A1 | 1/2009 | Sakai | |
| 2009/0059518 A1* | 3/2009 | Kakikawa | H05K 7/20563 361/679.53 |
| 2009/0065007 A1* | 3/2009 | Wilkinson | A61M 16/0677 128/205.27 |
| 2009/0086430 A1 | 4/2009 | Kang et al. | |
| 2009/0120629 A1 | 5/2009 | Ashe | |
| 2009/0122218 A1 | 5/2009 | Oh et al. | |
| 2009/0126906 A1 | 5/2009 | Dunn | |
| 2009/0126907 A1 | 5/2009 | Dunn | |
| 2009/0126914 A1 | 5/2009 | Dunn | |
| 2009/0135365 A1 | 5/2009 | Dunn | |
| 2009/0147170 A1 | 6/2009 | Oh et al. | |
| 2009/0154096 A1* | 6/2009 | Iyengar | H05K 7/20754 361/694 |
| 2009/0174626 A1 | 7/2009 | Isoshima et al. | |
| 2009/0231807 A1 | 9/2009 | Bouissier | |
| 2009/0244472 A1 | 10/2009 | Dunn | |
| 2009/0279240 A1 | 11/2009 | Karppanen | |
| 2009/0302727 A1* | 12/2009 | Vincent | H05K 7/1488 312/326 |
| 2009/0306820 A1 | 12/2009 | Simmons et al. | |
| 2009/0323275 A1* | 12/2009 | Rehmann | G06F 1/1632 361/679.48 |
| 2010/0060861 A1 | 3/2010 | Medin | |
| 2010/0079949 A1 | 4/2010 | Nakamichi et al. | |
| 2011/0019363 A1* | 1/2011 | Vahlsing | H05K 7/20972 361/695 |
| 2011/0085301 A1* | 4/2011 | Dunn | G02F 1/133385 361/695 |
| 2011/0085302 A1 | 4/2011 | Nakamichi et al. | |
| 2011/0116000 A1* | 5/2011 | Dunn | G02F 1/133382 349/58 |
| 2011/0122162 A1 | 5/2011 | Sato et al. | |
| 2012/0014063 A1* | 1/2012 | Weiss | H05K 7/20163 361/697 |
| 2012/0188481 A1 | 7/2012 | Kang et al. | |
| 2015/0366101 A1* | 12/2015 | Dunn | G02F 1/133385 349/69 |
| 2016/0041423 A1* | 2/2016 | Dunn | H05K 7/20154 362/97.3 |
| 2016/0195254 A1* | 7/2016 | Dunn | G02F 1/133308 362/97.3 |

FOREIGN PATENT DOCUMENTS

| | | |
|---|---|---|
| EP | 1408476 A1 | 4/2004 |
| EP | 1647766 A2 | 4/2006 |
| EP | 1762892 A1 | 3/2007 |
| EP | 1951020 A1 | 7/2008 |
| GB | 2402205 A | 12/2004 |
| JP | 402062015 A | 3/1990 |
| JP | 402307080 A | 12/1990 |
| JP | 3153212 A | 7/1991 |
| JP | H062337 U | 1/1994 |
| JP | 6082745 A | 3/1994 |
| JP | 8115788 A | 5/1996 |
| JP | 8194437 A | 7/1996 |
| JP | H8305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2001209126 A | 8/2001 |
| JP | 2002158475 A | 5/2002 |
| JP | 2004053749 A | 2/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 09307257 A | 11/2007 |
| JP | 2007293105 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 20100282109 A | 12/2010 |
| JP | 2011-75819 A | 4/2011 |
| JP | 2012-133254 A | 7/2012 |
| KR | 20000000118 U | 1/2000 |
| KR | 20000047899 A | 7/2000 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |

OTHER PUBLICATIONS

*Civiq Smartscapes, LLC V. Manufacturing Resources International, Inc.,* Claim Construction order, Oct. 3, 2018, 2 pages.
Anandan, Munismay, Progress of LED backlights for LCDs, 2008, 24 pages.
Itsenclosures, Product Catalog, 2009, 48 pages.
Novitsky, Driving LEDs versus CCFLs for LCD backlighting, Nov. 12, 2007, 6 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Zeeff, T.M., EMC analysis of an 18" LCD monitor, 2000, 1 page.
Mentley, David E., State of Flat-Panel Display Technology and Future Trends, Proceedings of the IEEE, Apr. 2002, vol. 90, No. 4, pp. 453-459.
*Civiq Smartscapes LLC. V Manufacturing Resources International, Inc.,* Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
Civiq, Invalidity Contentions, Jan. 24, 2018, 51 pages.
Civiq, Invalidity Claim Chart, Appendix I, Mar. 22, 2018, 4 pages.
Civiq, Invalidity Claim Charts, Appendix A-Appendix D, Jan. 24, 2018, 51 pages.
Bureau of Ships Navy Department, Guide Manual of Cooling methods for Electronic Equipment, Mar. 31, 1955, 212 pages.
Wankhede, Evaluation of Cooling Solutions for Outdoor Electronics, Sep. 17-19, 2007, 6 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Charts, Appendix F to H, Mar. 22, 2018, 18 pages.

(56) References Cited

OTHER PUBLICATIONS

Yung, Using Metal Core Printed Circuit Board as a Solution for Thermal Management article, 2007, 5 pages.

* cited by examiner

FIG-3

SYSTEM AND METHOD FOR MAINTAINING A CONSISTENT TEMPERATURE GRADIENT ACROSS AN ELECTRONIC DISPLAY

CROSS-REFERENCE TO RELATED APPLICATIONS

This application is a continuation of U.S. application Ser. No. 14/247,658 filed on Apr. 8, 2014, which is a continuation of U.S. application Ser. No. 12/952,745 filed on Nov. 23, 2010, now U.S. Pat. No. 8,693,185 issued Apr. 8, 2014. U.S. application Ser. No. 12/952,745 is a non-provisional application of U.S. Provisional Application No. 61/321,364 filed Apr. 6, 2010. U.S. application Ser. No. 12/952,745 is also continuation-in-part of U.S. application Ser. No. 12/641,468 filed Dec. 18, 2009, now U.S. Pat. No. 8,654,302 issued Feb. 18, 2014, which is a non-provisional application of U.S. Provisional Application No. 61/138,736 filed Dec. 18, 2008. U.S. application Ser. No. 12/952,745 is also a continuation-in-part of U.S. application Ser. No. 12/411,925 filed Mar. 26, 2009, now U.S. Pat. No. 8,854,595 issued Oct. 7, 2014, which is a non-provisional application of U.S. Provisional Application No. 61/039,454 filed Mar. 26, 2008. U.S. application Ser. No. 12/952,745 is also a continuation-in-part of U.S. application Ser. No. 12/556,029 filed Sep. 9, 2009, now U.S. Pat. No. 8,373,841 issued Feb. 12, 2013, which is a non-provisional application of U.S. Provisional Application No. 61/095,615 filed Sep. 9, 2008. U.S. application Ser. No. 12/952,745 is also a continuation-in-part of U.S. application Ser. No. 12/620,330 filed Nov. 17, 2009, now U.S. Pat. No. 8,274,622 issued Sep. 25, 2012, which is a non-provisional application of U.S. Provisional Application No. 61/115,333 filed Nov. 17, 2008. U.S. application Ser. No. 12/952,745 is also a continuation-in-part of U.S. application Ser. No. 12/706,652 filed Feb. 16, 2010, now U.S. Pat. No. 8,358,397 issued Jan. 22, 2013, which is a non-provisional application of U.S. Provisional Application No. 61/152,879 filed Feb. 16, 2009. U.S. application Ser. No. 12/952,745 is also a continuation-in-part of U.S. application Ser. No. 12/630,469 filed December 3, 2009, now U.S. Pat. No. 8,497,972 issued Jul. 30, 2013. U.S. application Ser. No. 12/952,745 is also a continuation-in-part of U.S. application Ser. No. 12/618,104 filed Nov. 13, 2009, now U.S. Pat. No. 8,310,824 issued Nov. 13, 2012. U.S. application Ser. No. 12/952,745 is also a continuation-in-part of U.S. application Ser. No. 12/905,704 filed Oct. 15, 2010, now U.S. Pat. No. 8,773,633 issued Jul. 8, 2014, which is a non-provisional application of U.S. Provisional Application No. 61/252,295 filed Oct. 16, 2009. U.S. application Ser. No. 12/952,745 is also a continuation-in-part of U.S. application Ser. No. 12/753,298 filed Apr. 2, 2010, now U.S. Pat. No. 8,351,014 issued Jan. 8, 2013. All aforementioned applications are hereby incorporated by reference in their entirety as if fully cited herein.

TECHNICAL FIELD

Exemplary embodiments described herein generally relate to cooling systems, and in particular, to cooling systems for electronic displays.

BACKGROUND OF THE ART

Improvements to electronic displays now allow them to be used in outdoor environments for informational, advertising, or entertainment purposes. While displays of the past were primarily designed for operation near room temperature, it is now desirable to have displays which are capable of withstanding large surrounding environmental temperature variations. For example, some displays are capable of operating at temperatures as low as −22 F and as high as 113 F or higher. When surrounding temperatures rise, the cooling of the internal display components can become even more difficult.

Additionally, modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices (ex. LED, organic LED, light emitting polymer (LEP), organic electro luminescence (OEL), and plasma assemblies) may produce a relatively large amount of heat.

Still further, in some situations radiative heat transfer from the sun through a front display surface can also become a source of heat. In some locations 800-1400 Watts/$m^2$ or more through such a front display surface is common. Furthermore, the market is demanding larger screen sizes for displays. With increased electronic display screen size and corresponding front display surfaces, more heat will be generated and more heat will be transmitted into the displays.

Given the well-known thermodynamic property that cool air falls and hot air rises, it was previously thought that the best way to cool an electronic display was to ingest the cool air which is found near the bottom of the display. Ingesting the warm air near the top of the display as the cooling air did not seem to make thermodynamic sense. While the air near the bottom of the display is sometimes cooler than the air near the top of the display, it was found that this is not always the case. Especially in applications where the display is mounted on a sidewalk or paved environment, heat was found to emanate from the pavement and cause the air near the bottom of the display to have a higher temperature than the air found at the top. Further, the environment near the bottom of the display was found to contain various contaminants such as dirt, dust, water, leaves, and even garbage/waste materials. These contaminants can have an adverse effect on the display if ingested or clogging up the cooling air intake.

Also, when cooling air was used to cool the rear portion of an electronic display (sometimes an LED backlight or LED display) it was found that the area where the cooling air was ingested was maintained at a cooler temperature than the area where the cooling air was exhausted. Temperature variations across an electronic display may be undesirable as they can alter the optical performance of the electronic display. Some components perform differently when subjected to different ambient temperatures. Thus, with temperature variations across an electronic display there can be visible variations in the image generated by the electronic display.

SUMMARY OF THE EXEMPLARY EMBODIMENTS

An exemplary electronic display may be placed in thermal communication with a plurality of thermally conductive ribs where the ribs are placed in the path of cooling air. The heat from the electronic display is distributed throughout the ribs and removed by the cooling air. It has been discovered that forcing air through the relatively narrow channels defined by the ribs improves the ability to remove heat from the electronic display.

For example, and not by way of limitation, LED arrays are commonly used as the illumination devices for LCD displays. As mentioned above, it has been found that the optical properties of LEDs (and other illumination devices) can vary depending on temperature. Thus, when an LED is exposed to room temperatures, it may output light with a certain luminance, wavelength, and/or color temperature. However, when the same LED is exposed to high temperatures, the luminance, wavelength, color temperature, and other properties can vary. Thus, when a temperature variation occurs across an LED backlight (some areas are at a higher temperature than others) there can be optical inconsistencies across the backlight which can be visible to the observer. By using the embodiments herein, heat buildup can be evenly distributed across the ribs and removed from the display. This can prevent any potential 'hot spots' in the backlight which may become visible to the observer because of a change in optical properties of the illumination devices (sometimes LEDs). OLED assemblies are also known to vary performance when temperatures vary. These types of displays can also be adequately cooled with the embodiments herein.

The ribs may provide an isolated chamber from the rest of the display so that ambient air can be ingested and used to cool the ribs. This is beneficial for situations where the display is being used in an outdoor environment and the ingested air may contain contaminants (pollen, dirt, dust, water, smoke, etc.) that would damage the sensitive electronic components of the display. While an exemplary embodiment could accept some contaminants, it may still be desirable to limit the amount of contaminants that could be ingested into the display. Thus, some embodiments ingest cooling air from the top of the display. The air near the top of the display has been found to occasionally contain less contaminants than the air at the bottom of the display. Still further, in some applications where the display is mounted in a paved location, heat can radiate from the paved surface below and cause the air near the top of the display to actually be cooler than the air near the bottom of the display. In these situations it might make thermodynamic sense to ingest air from the top of the display.

When ingesting air from the top, it has been found that as the cooling air travels across the rear portion of the electronic display and accepts heat it increases in temperature. Once the cooling air reaches the bottom of the display, it may have increased in temperature substantially and may no longer provide adequate cooling to the bottom portion of the display. Therefore, some embodiments vary the density of the thermally conductive ribs so that a consistent temperature gradient can be achieved across the electronic display. Because the bottom portion is typically warmer, the ribs may be at a higher density in the bottom portion to account for this variation.

If a backlight is used with the particular display application, a backlight with front and rear sides may be used where the front side contains the illumination devices and the rear side contains a thermally conductive surface for dissipating the heat from the illumination devices. Ideally, there should be a low level of thermal resistance between the front and rear sides of the backlights. An exemplary embodiment that requires a backlight may use a metal core PCB with LEDs on the front side and a metallic surface on the rear side.

The foregoing and other features and advantages will be apparent from the following more detailed description of the particular embodiments of the invention, as illustrated in the accompanying drawings.

BRIEF DESCRIPTION OF THE DRAWINGS

A better understanding of the exemplary embodiments will be obtained from a reading of the following detailed description and the accompanying drawings wherein identical reference characters refer to identical parts and in which.

DETAILED DESCRIPTION OF EXEMPLARY EMBODIMENTS

Figure 1:
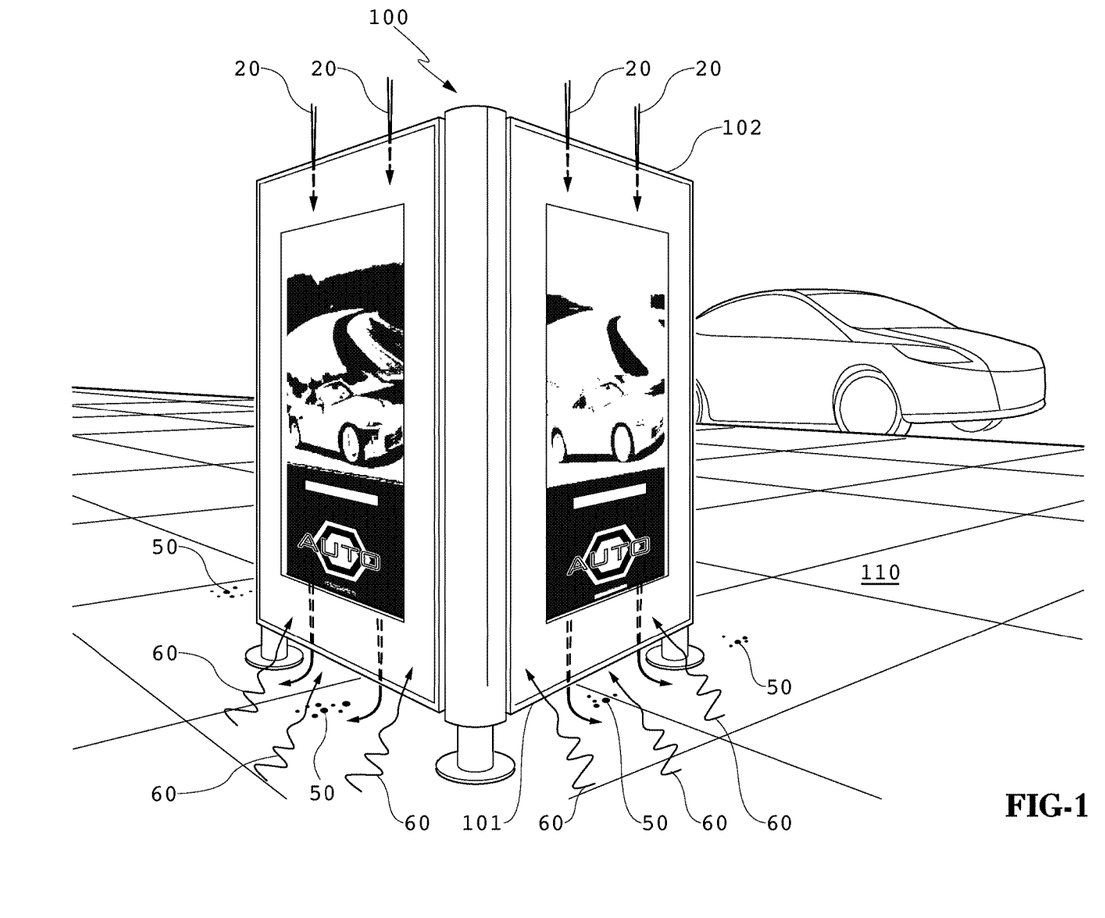
FIG. 1 is a perspective view of an exemplary embodiment mounted in a paved environment.

FIG. 1 provides a perspective view of an exemplary embodiment of an electronic display 100 mounted on a paved outdoor surface 110. Contaminants 50 may be present on the paved outdoor surface 110 and if the display 100 were to ingest air from the bottom 101, these contaminants 50 would likely be ingested into the display 100. Further, heat 60 is shown radiating from the paved outdoor surface 110. If the display 100 were to ingest air from the bottom 101 it would also likely be warmer than the heat near the top 102 because of the radiating heat 60 from the paved outdoor surface 110.

Thus, the embodiment shown ingests air from the top 102 of the display 100 so that the bulk of the contaminants 50 can be avoided. An opening may be located along the top 102 of the display, preferably along the top horizontal surface of the display 100 housing. Another opening may be located along the bottom 101 horizontal surface. Further, the cooling air 20 can sometimes enter the display 100 at a lower temperature at the top 102 than air which is present near the bottom 101 of the display 100. While this may seem counter-intuitive based on the laws of thermodynamics, acceptable results have been observed.

Figure 2:
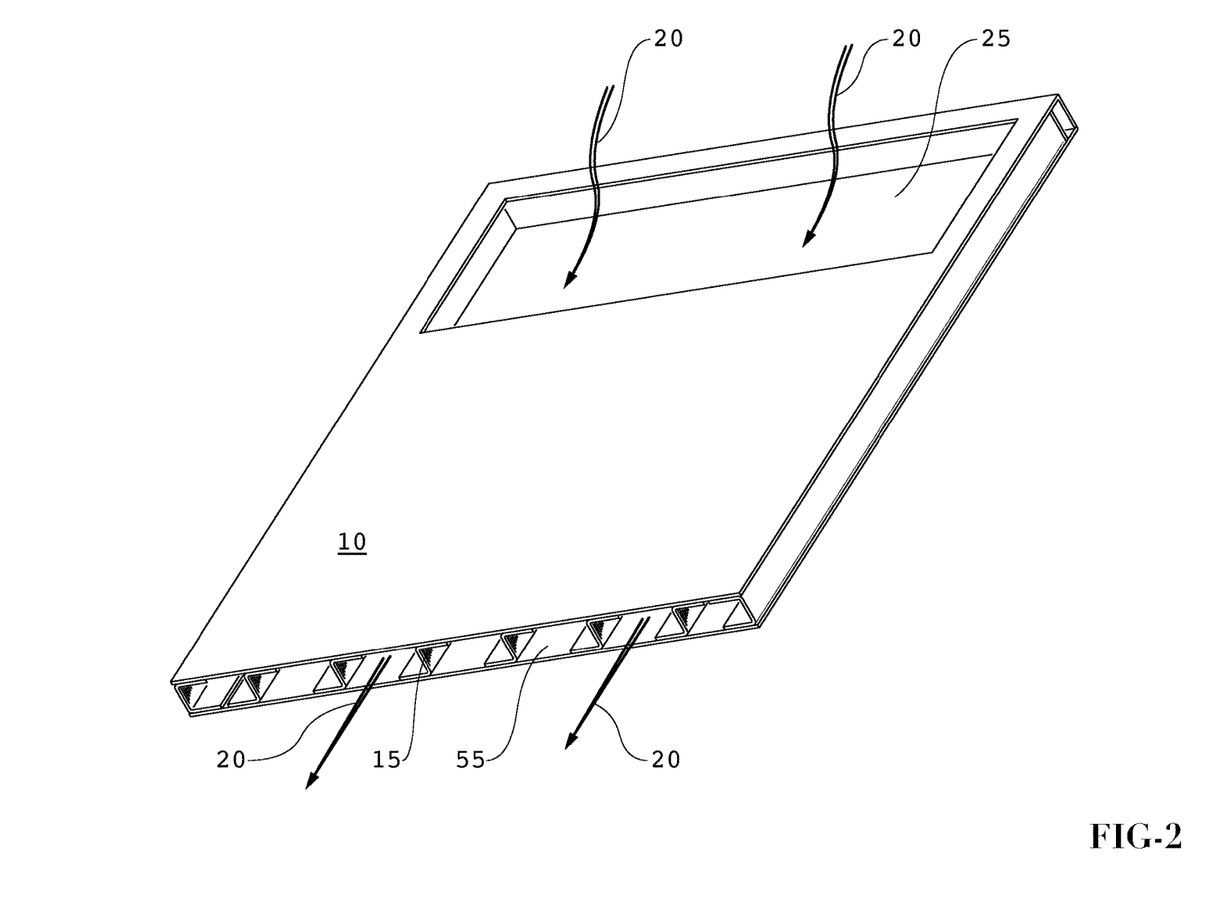
FIG. 2 is a rear perspective section view of an exemplary set of thermally-conductive ribs and the air inlet aperture.

FIG. 2 provides a sectional view of an exemplary embodiment for thermally-conductive ribs 15, which may be sandwiched in between a front plate 55 (preferably thermally conductive) and a rear plate 10. Preferably, the ribs 15 are in thermal communication with the front plate 55. The front plate 55 may be in thermal communication with the electronic display or electronic image assembly (not shown) so that heat from the electronic display can flow to the front plate 55 and into the ribs 15. Due to the thermally-conductive nature of the ribs 15 and the thermal communication between the front plate 55 and the ribs 15, heat which is present within the electronic display may be removed by the ribs 15. In an exemplary embodiment, a path of cooling air 20 is used to remove the heat which has accumulated on the ribs 15.

In an exemplary embodiment, the plate 10 would provide a gaseous and contaminant barrier between the side containing the ribs 15 and the opposing side (which may house various electronic assemblies). If the plate 10 provides an adequate barrier, ambient air may be ingested as cooling air 20 and the risk of contaminants entering the side of the plate 10 containing the sensitive electronic components may be reduced or eliminated. In a similar exemplary embodiment, the front plate 55 would also provide a gaseous and contaminant barrier between the side containing the ribs 15 and the opposing side which may be in thermal communication with the electronic display. This figure also provides one example of an inlet aperture 25 which accepts the cooling air 20 and directs it along the ribs 15. The cooling air 20 may not only remove heat from the ribs 15 but may also remove it from the front plate 55 and optionally the rear plate 10.

The ribs 15 shown in this embodiment contain a 'Z' cross-section, but this is not required. Other embodiments may contain ribs with I-beam cross-sections, hollow square cross-sections, hollow rectangular cross-section, solid rectangular or solid square cross-sections, 'T' cross-sections, a honeycomb cross-section, or any combination or mixture of these.

Figure 3:
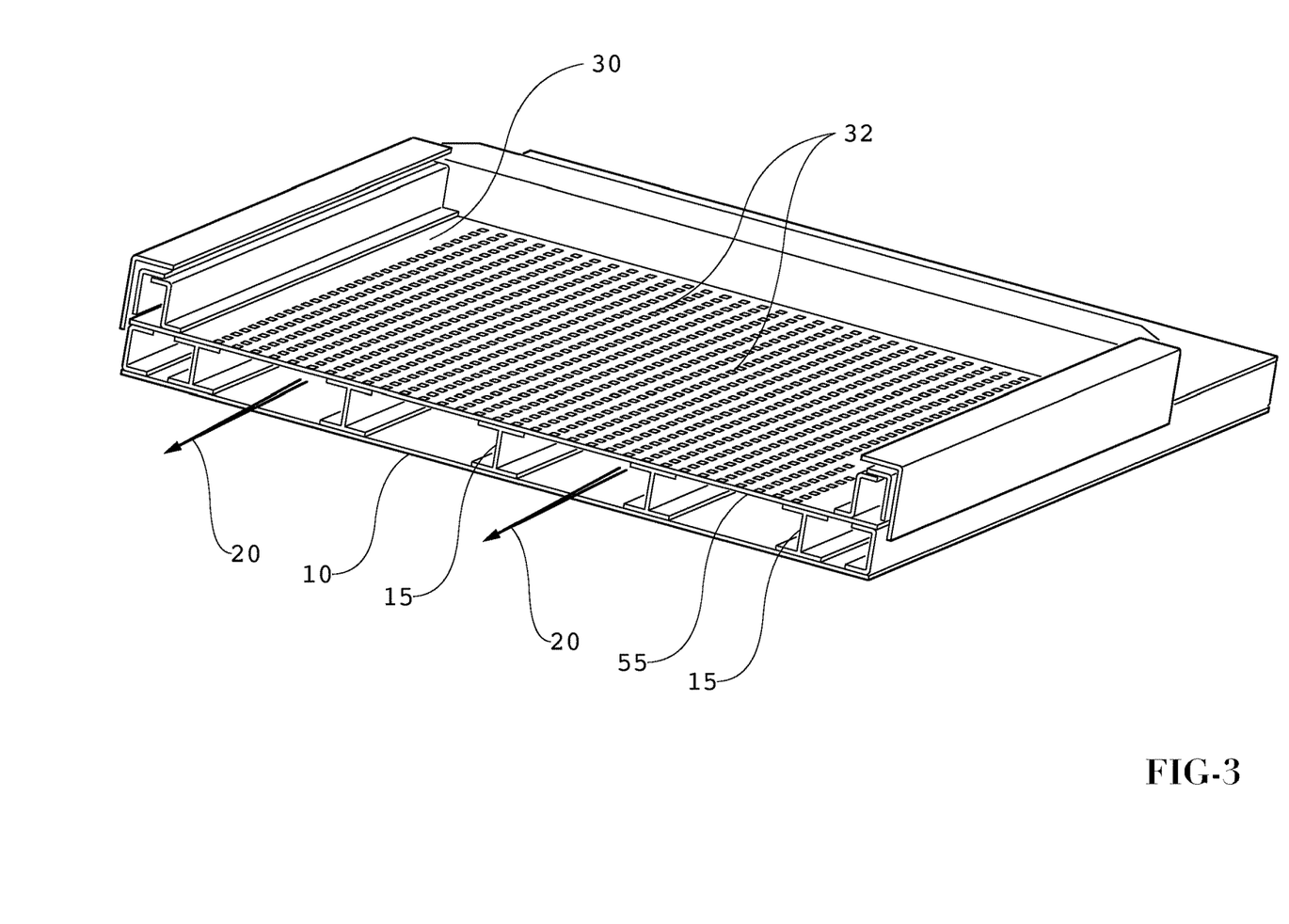
FIG. 3 is a front perspective section view of an embodiment for cooling a backlight with thermally-conductive ribs.

FIG. 3 shows a front perspective section view of an embodiment for cooling a backlight with thermally-conductive ribs 15. The backlight assembly in this embodiment includes a plurality of illumination devices 32 which are mounted on a thermally conductive substrate 30. In an exemplary embodiment, the illumination devices 32 would be LEDs and the thermally conductive substrate 30 would be a PCB and more preferably a metal core PCB. On the surface of the thermally conductive substrate 30 which faces the ribs 15 there may be a thermally conductive front plate 55. In an exemplary embodiment, the thermally conductive front plate 55 would be metallic and more preferably aluminum. It is preferred that the ribs 15 are in thermal communication with the thermally conductive plate 55 and that the thermally conductive plate 55 is in thermal communication with the thermally conductive substrate 30. In some embodiments however, the thermally conductive substrate 30 may comprise traditional PCB materials rather than a metal core PCB or highly thermally conductive materials. It is preferable that there is a low level of thermal resistance between the illumination devices 32 and the ribs 15. Cooling air 20 may again be forced along the ribs 15 in order to remove heat absorbed from the backlight assembly.

As noted above, many illumination devices (especially LEDs and OLEDs) may have performance properties which vary depending on temperature. When 'hot spots' are present within a backlight or illumination assembly, these hot spots can result in irregularities in the resulting image which might be visible to the end user. Thus, with the embodiments described herein, the heat which may be generated by the backlight assembly can be distributed (somewhat evenly) throughout the various ribs and thermally-conductive surfaces to remove hot spots and cool the backlight and/or electronic display.

In a further exemplary embodiment, the ribs 15 can also be used to cool additional electronic assemblies by placing them in thermal communication with the rear plate 10. Thus, with the ribs 15 in a central location, the 'front' would be towards an intended observer of the display while the 'back' would be on the opposite side of an intended observer. Therefore, the front side of the ribs 15 would be in thermal communication with some portion of the electronic display assembly and the rear side of the ribs may be in thermal communication with a rear plate 10 (possibly being thermally-conductive). A single path of cooling air can then be used to cool the interior of the display while the various hot spots can distribute heat throughout the ribs and other thermally conductive surfaces to provide the most efficient cooling.

Figure 4A:
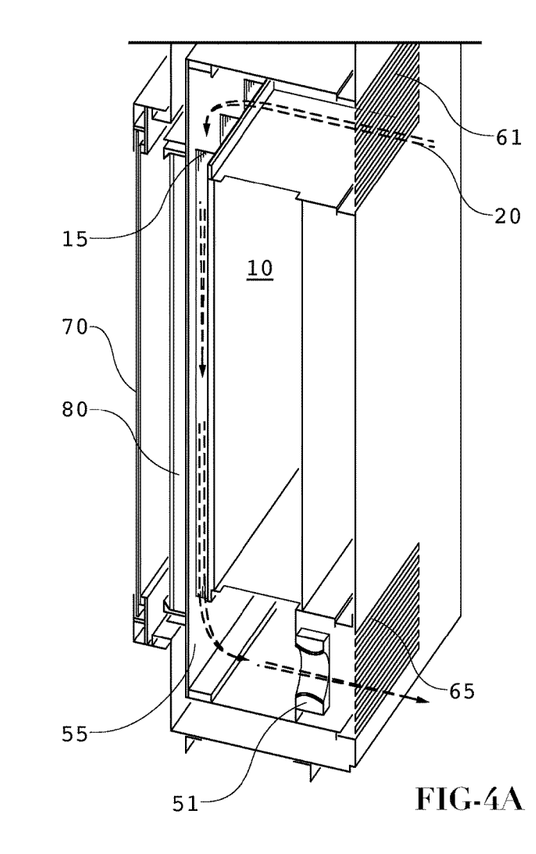
FIG. 4A is a perspective section view of an embodiment showing a path for the cooling air.

FIG. 4A is a perspective section view of an embodiment showing a path for the cooling air 20 through the inlet 61 and exhaust 65 apertures. One or more fans 51 may be used to draw the air 20 into the inlet aperture 61 and through the ribs 15. Although shown at the bottom of the display near the exhaust aperture 65, the fans 51 may be placed anywhere within the display so that an adequate flow of cooling air 20 is supplied. Thus, although shown in the figure as 'pulling' the cooling air 20 through the ribs 15, other embodiments may 'push' the cooling air 20 instead. Still further, some embodiments may 'push' and 'pull' the cooling air 20. In some embodiments, the air 20 may be air conditioned before it is directed along the ribs 15. In some embodiments, the air 20 may be filtered before it is directed along the ribs 15 in order to remove contaminants. In the embodiment shown, thermally conductive front plate 55 is in thermal communication with the front side of the ribs 15. Preferably, the front plate 55 is also in thermal communication with the electronic display image assembly 80, which could be but is not limited to any of the following: liquid crystal display (LCD), OLED, plasma display assembly, light emitting polymer (LEP) assembly, organic electro luminescence (OEL) assembly, or LED display assembly.

The front plate 55 may be the rear surface of an OLED assembly or the rear surface of an LED backlight assembly for an LCD. A front protective glass 70 is used to protect the electronic display image assembly 80 from damage. Solar loading (radiative heat transfer from the sun through the front protective glass 70) may result in a heat buildup on the electronic display image assembly 80. Thermal communication between the electronic display image assembly 80 and the front plate 55 can provide a means for transferring the solar loading (and any other heat buildup) on the electronic display image assembly 80 to the ribs 15, cooling air 20, and out of the display through the exhaust aperture 65. The front plate 55 can also be the rear surface of any backlight assembly, plasma display assembly, light emitting polymer (LEP) assembly, organic electro luminescence (OEL) assembly, or LED display assembly.

Figure 4B:
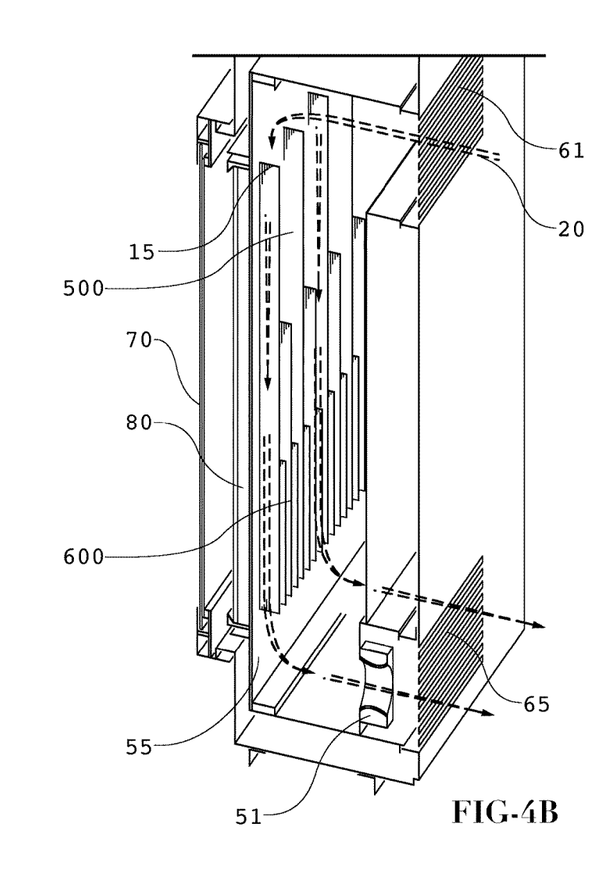
FIG. 4B is a perspective section view of the embodiment of FIG. 4A where the rear plate has been removed so that the variation in rib density can be observed.

FIG. 4B is a perspective section view of the embodiment of FIG. 4A where the rear plate 10 has been removed so that the optional variation of density in the ribs 15 can be observed. As mentioned above, as cooling air 20 enters the inlet aperture 61 the temperature of the air is relatively low and its ability to cool the upper portion 500 of the display is relatively good. However, as the cooling air 20 travels through the ribs 15, more heat is absorbed by the cooling air 20 and thus raises the temperature of the cooling air 20. Therefore, once cooling air 20 reaches the lower portion 600 of the display, it has risen in temperature and is no longer as effective at removing heat from the ribs 15, electronic image assembly 80, front plate 55, and possibly even the rear plate 10. If heat is not removed at the lower portion 600 in a similar amount as the top portion 500, there may be a temperature variance between the top of the display and the bottom of the display. As discussed above, a variation in temperature across the display can sometimes cause variations in optical properties of various components and a resulting variation of the image.

To counteract this phenomenon, in some embodiments the density of the ribs 15 may optionally be higher in the lower portion 600 than in the upper portion 500 to account for the reduction in heat transfer efficiency due to the higher temperature of the cooling air 20. By providing an increased amount of surface area for the cooling air 20 to contact, heat can be removed from the lower portion 600 (where the cooling air is relatively warm) in a similar amount as the heat removed from the upper portion 500 (where the cooling air 20 is relatively cool). This optional technique can help to balance the temperature across the front plate 55 and thus the electronic image assembly 80 to ensure that the image remains consistent across the display.

It should be noted that although the inlet 61 and exhaust 65 apertures are shown in a vertical orientation on the rear wall (opposite the viewable surface) of the display housing, they can also be placed on the sides of the housing. Alternatively, the inlet aperture 61 may be on the top horizontal surface of the display housing while the exhaust aperture 65 is on the bottom horizontal surface of the display housing.

Although some of the figures herein may show displays which are oriented in a portrait fashion, any orientation can be used with the embodiments described herein. Thus, landscape or widescreen orientations can also be used as well as any type of square orientation.

In some embodiments, the display may not be mounted on a paved surface (or some other object/surface that is radiating heat). In these embodiments, it may be desirable to ingest air from the bottom of the display because this air might be cooler than the air at the top of the display. In this type of design, the variation in rib density may still be used to account for the warming of the cooling air as it travels up the display and exhausts out the top. Here, the top of the display will likely be warmer than the bottom and providing a higher density of ribs near the top of the display can help to balance this thermal irregularity to ensure a consistent image production.

The cooling system may run continuously. However, if desired, temperature sensing devices (not shown) may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

It is to be understood that the spirit and scope of the disclosed embodiments provides for the cooling of many types of displays. By way of example and not by way of limitation, embodiments may be used in conjunction with any of the following: LCD (all types), light emitting diode (LED), organic light emitting diode (OLED), field emitting display (FED), light emitting polymer (LEP), organic electro luminescence (OEL), and plasma displays. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition liquid crystal displays (LCD). While the embodiments described herein are well suited for outdoor environments, they may also be appropriate for indoor applications (e.g., factory/industrial environments, spas, locker rooms) where thermal stability of the display may be at risk.

Having shown and described various exemplary embodiments, those skilled in the art will realize that many variations and modifications may be made to affect the described embodiments and still be within the scope of the included claims. Additionally, many of the elements indicated above may be altered or replaced by different elements which will provide the same result and fall within the spirit of the claimed invention.

What is claimed is:

1. An electronic display assembly with forced-air cooling, comprising:
   a housing having a front side, a rear side, a top and a bottom;
   an electronic display located at least partially within the housing so as to be viewable along the front side thereof;
   a thermally conductive plate located behind the electronic display and in thermal communication therewith, a space between the plate and the rear side of the housing defining a gap;
   an external air inlet opening located near the top of the housing, the external air inlet opening in flow communication with the gap;
   an external air exhaust opening located near the bottom of the housing and at a lower elevation than the external air inlet opening, the external air exhaust opening in flow communication with the gap; and
   at least one fan in flow communication with the gap, the at least one fan being operative to produce an air inlet opening-to-air exhaust opening directed flow of external air through the gap.

2. The electronic display assembly of claim 1, wherein the electronic display is selected from the group consisting of a liquid crystal display (LCD), a light emitting diode (LED) display, an organic light emitting diode (OLED) display, a light emitting polymer (LEP) display, an organic electroluminescence (OEL) display, and a plasma display.

3. The electronic display assembly of claim 2, wherein the thermally conductive plate is the rear surface of an OLED assembly or the rear surface of a LED backlight assembly for a LCD.

4. The electronic display assembly of claim 1, wherein the thermally conductive plate engages the housing so as to form a gas and contaminant barrier between the electronic display and the gap.

5. The electronic display assembly of claim 1, wherein the at least one fan is located near the external air exhaust opening and is operative to pull external air through the gap.

6. The electronic display assembly of claim 1, wherein the at least one fan is placed near the external air inlet opening and is operative to push external air through the gap.

7. The electronic display assembly of claim 1, further comprising a plurality of thermally conductive ribs located within the gap, the ribs being in thermal communication with the electronic display via contact with the thermally conductive plate.

8. The electronic display assembly of claim 7, wherein the thermally conductive ribs are metallic.

9. The electronic display assembly of claim 7, wherein the ribs are arranged at a higher density near the bottom of the display housing than near the top of the display housing.

10. The electronic display assembly of claim 7, wherein the cross-sectional shape of the ribs is selected from the group consisting of a 'Z' cross-section, a 'T' cross-section, an I-beam cross-section, a hollow square cross-section, a hollow rectangular cross-section, a solid square cross-section, a solid rectangular cross-section, a honeycomb cross-section, and combinations thereof.

11. A combined conductive and convective method of cooling an electronic display assembly, the electronic display assembly including a housing having a front side, a rear side, a top and a bottom, and an electronic display located within the housing so as to be viewable along the front side thereof, the cooling method comprising:

locating a thermally conductive plate behind the electronic display and in thermal communication therewith, such that a gap exists between the plate and the rear side of the housing;

providing an external air inlet opening that is located near the top of the housing and is in flow communication with the gap;

providing an external air exhaust opening that is located near the bottom of the housing and is in flow communication with the gap, the external air exhaust opening located at a lower elevation than the external air inlet opening; and     placing at least one fan in flow communication with the gap, operation of the at least one fan causing external air to flow into the external air inlet opening, through the gap, and out of the air exhaust opening, thereby removing heat from the electronic display that has been conductively transferred into the gap through the thermally conductive plate.

\* \* \* \* \*